United States Patent [19]
Pianka

[11] Patent Number: 5,345,356
[45] Date of Patent: Sep. 6, 1994

[54] ESD PROTECTION OF OUTPUT BUFFERS

[75] Inventor: Juergen Pianka, Bethlehem, Pa.

[73] Assignee: AT&T Bell Laboratories, Murray Hill, N.J.

[21] Appl. No.: 893,997

[22] Filed: Jun. 5, 1992

[51] Int. Cl.$^5$ .............................................. H02H 9/04
[52] U.S. Cl. ...................................... 361/56; 361/91; 361/111; 361/118
[58] Field of Search ..................... 361/56, 58, 91, 111, 361/118; 307/448, 443; 357/355

[56] References Cited

U.S. PATENT DOCUMENTS

| | | | |
|---|---|---|---|
| 4,806,999 | 2/1989 | Strauss | 357/23.13 |
| 4,990,802 | 2/1991 | Smooha | 307/462 |
| 5,208,719 | 5/1993 | Wei | 361/56 |

OTHER PUBLICATIONS

"Dynamic Gate Coupling of NMOS For Efficient Output ESD Protection", by Charvaka Duvvury and Carlos Diaz, Texas Instruments Inc., Semiconductor Process Design Center, pp. 141 through 150, 30th Annual Proceedings, Reliability Physics 1992, San Diego, Calif., Mar. 31, Apr. 1, 2, 1992.

IEEE Catalog No. 92CH3084-1, Sponsored by the IEEE Electron Devices Society and the IEEE Reliability Society, Copy 1992 by the Institute of Electrical and Electronics Engineers, Inc., 345 E. 47th St., New York, NY 10017.

Primary Examiner—A. D. Pellinen
Assistant Examiner—S. Jackson
Attorney, Agent, or Firm—James H. Fox

[57] ABSTRACT

A particular electrostatic discharge (ESD) protection problem is faced when only n-channel output transistors are present, since there is no p-n junction that could serve to clamp positive ESD voltages, as would be the case if a p-channel output transistor were present. In the present technique, the output transistor itself is used to conduct the ESD current to a power supply conductor ($V_{SS}$). To assist in the turn-on of the n-channel output transistor, a transistor couples the bond pad to the n-tub in which the p-channel pre-driver transistor is formed. Conduction through this transistor raises the n-tub voltage when an ESD event occurs, thereby preventing the p-n junction of the p-channel pre-driver transistor from clamping the turn-on voltage, which would limit the protection obtained by this technique. This technique is especially valuable for SCSI (Small Computer System Interface) chips, since only n-channel output transistors are used. It may also be used in TTL-output buffers, which also use n-channel pull-up and pull-down devices. P-channel devices may be comparably protected.

10 Claims, 2 Drawing Sheets

ESD PROTECTION OF OUTPUT BUFFERS

BACKGROUND OF THE INVENTION

1. Field of the Invention

The present invention relates to an integrated circuit having protection from electrostatic discharge (ESD).

2. Description of the Prior Art

The protection of integrated circuits from electrostatic discharge has been a significant design issue, especially as transistor electrode dimensions shrink below the 1.5 micron level. An excessively high ESD voltage conducted from a package terminal to the integrated circuit bond pad can easily damage input or output circuitry, unless protection techniques are adopted. It appears that the use of the lightly-doped drain (LDD) structure and silicided source/drain regions has increased ESD susceptibility, especially in output buffers that utilize n-channel field effect transistors. One recent study by C. Duvvury and C. Diaz, "Dynamic Gate Coupling of NMOS for Efficient Output ESD Protection" Proceedings of the IRPS (1992), indicates that improved ESD performance can be obtained using a field oxide capacitor to couple the gate of the output transistor to the bond pad; see FIG. 6 therein. In that technique, the output transistor is made to carry the ESD current. However, the field oxide capacitor undesirably increases the capacitive lead on the bond pad, requiring a larger output transistor.

A somewhat similar prior-art technique is shown in FIG. 1, wherein an output buffer 10 is connected to the bond pad 11. A protective n-channel transistor 13 is connected to the bond pad for conducting ESD current (I) to the power supply conductor ($V_{SS}$). The ESD voltage is conducted to the gate of transistor 13 by capacitor 12, typically about 10 picofarads in one design. This conduction tends to allow transistor 13 to conduct by means of bipolar break-down action during an ESD event, allowing the current I to flow. The resistor 14, typically about 2 kilohms, causes the positive charge on the gate of transistor 13 to be conducted to $V_{SS}$, thereby turning transistor 13 off after the ESD event has dissipated. In this manner, transistor 13 does not conduct during normal operation of the output buffer. However, the circuitry of FIG. 1 requires that the protective transistor be sufficiently large so as to be able to carry the relatively large ESD current. This requirement increases the area required to implement the output buffer. In addition, the transistor 13 presents an additional capacitive lead to the buffer 10, which again undesirably requires that the buffer have additional drive capability, and hence increased size.

In some cases, protection against positive ESD voltages is improved by the presence of a p-channel output transistor. In that case, the p-n junction of the drain electrode, which is connected to the bond pad, provides for clamping positive ESD voltages to a power supply conductor. However, some designs use only n-channel output transistors. For example, TTL output buffers typically use n-channel transistors for both the pull-up and pull-down devices. More recently, the Standard Computer Systems Interface (SCSI) chips have output buffers that typically use only n-channel transistors. It is therefore desirable to have an improved ESD protection technique that is effective with output buffers, and which mitigates certain problems associated with the prior-art techniques.

SUMMARY OF THE INVENTION

I have invented a technique for protecting output transistors, wherein means are provided to cause an output transistor to conduct during an ESD event. The doped semiconductor region (e.g., n-tub) in which a pre-driver transistor (e.g., p-channel) is formed is coupled to the output conductor so as to be raised in voltage when an ESD event occurs. This arrangement allows the output transistor to more fully turn on during an ESD event, without being clamped by the diode formed by the pre-driver transistor and the tub region in which it is formed. In this manner, the output transistor is allowed to conduct the ESD current to a power supply conductor.

DETAILED DESCRIPTION

The present detailed description relates to an improved integrated circuit electrostatic discharge protection technique. It may advantageously be used with output buffers having pull-up and pull-down transistors of a single conductivity type. In the illustrative case, n-channel output devices are shown. A comparable protective circuit for use with p-channel output devices is the same as that shown, except that p-channel transistors are used in lieu of n-channel transistors, and the power supply connections are the opposite of those shown.

Figure 2:
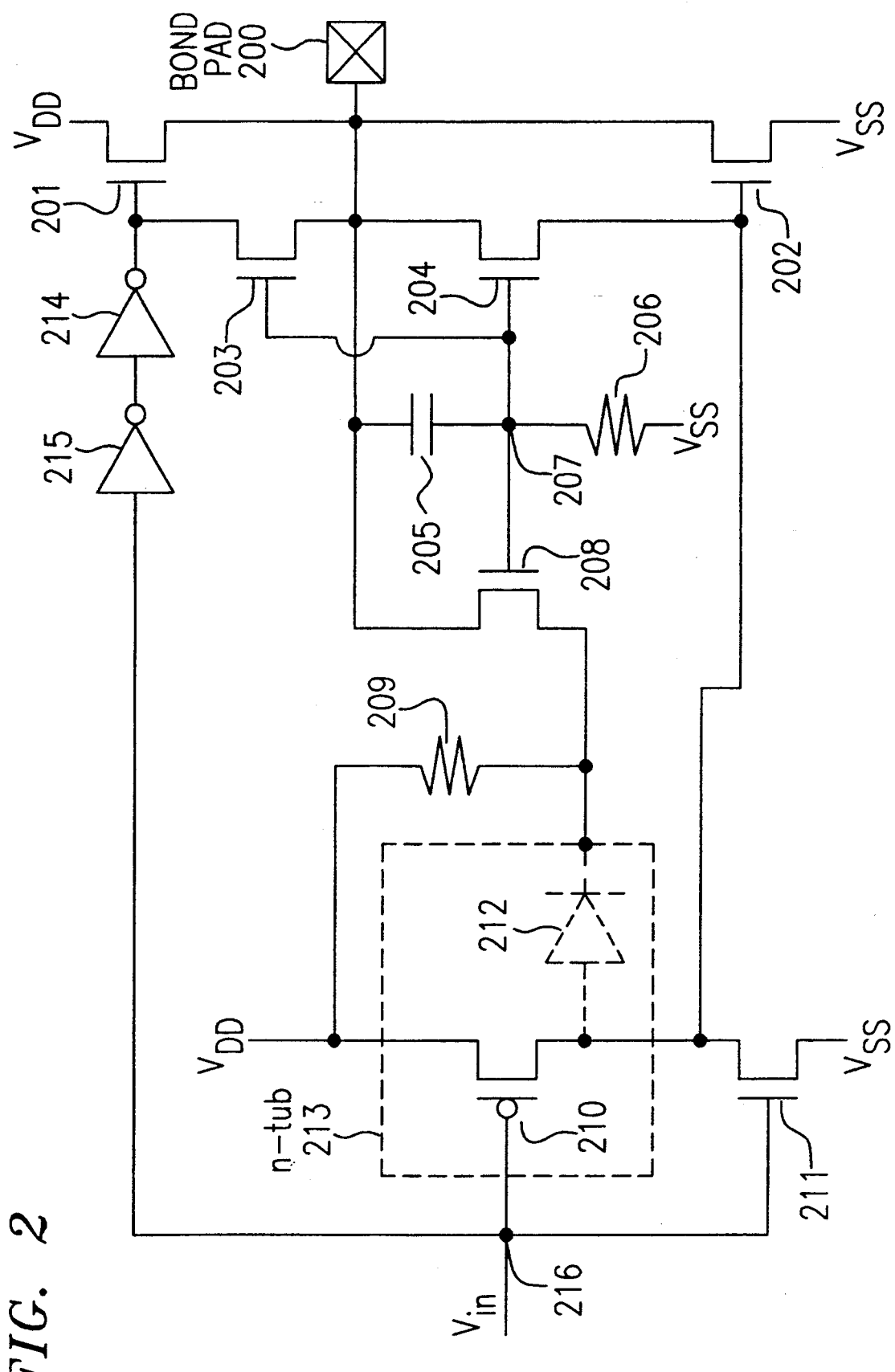
FIG. 2 shows an illustrative embodiment of the present invention.

Referring to the illustrative embodiment of FIG. 2, an output conductor (bond pad 200) is connected to n-channel pull-up transistor 201 and n-channel pull-down transistor 202. In one illustrative embodiment the invention, the gates of transistors 201 and 202 are connected to protective transistors 203 and 204, which are also connected to bond pad 200 as shown. Furthermore, the gates of protective transistors 203 and 204 are connected to capacitor 205 and resistor 206 at common node 207. During a positive-voltage ESD event, the high voltage is conducted through capacitor 205 to the gates of transistors 203 and 204. This conduction increases the voltage on the gates of these transistors to approximately the same voltage as on their sources/drain regions also connected to bond pad 200. This reduces the breakdown voltage across transistors 203 and 204, allowing them to conduct by means of bipolar action at a relatively low voltage. (As is well known in the art, each MOS transistor may be considered to have a bipolar transistor connected in parallel, comprising emitter, base, and collector regions corresponding to the source, channel, and drain regions of the MOS device.) This conduction through protective transistors 203 and 204 also raises the voltage on the gates of output transistors 201 and 202, respectively. This conduction also lowers the breakdown thresholds of these output transistors, allowing bipolar conduction through these transistors to conduct the ESD current to their respective power supply conductors, $V_{DD}$ and $V_{SS}$.

After a certain period of time following the onset of an ESD event, conduction of current through resistor 206 to the $V_{SS}$ conductor lowers the voltage on node 207, and hence on the gates of protective transistors 203 and 204. The lower gate voltage raises the breakdown threshold of these transistors, and turns them off at some point. Therefore, the gates of output transistors 201 and 202 are no longer placed at a high voltage, and these transistors also cease to conduct by means of bipolar breakdown action at some point. However, in normal circuit operation, the node 207 is held low through resistor 206, and so conduction through the protective transistors 203 and 204 does not occur. Therefore, normal circuit operation is not impaired. I recommend that capacitor 205 have a value in the range of from 0.2 to 50 picofarads, and resistor 206 have a value in the range of from 200 ohms to 50 kilohms. Further, I recommend that the RC time constant provided by these devices be preferably in the range of from 1 to 50 nanoseconds. In an illustrative embodiment, capacitor 205 has a nominal value of 3.3 picofarads, whereas resistor 206 has a nominal value of 3 kilohms. These values provide a nominal RC time constant of about 10 nanoseconds.

I recommend that the circuitry be designed so that conduction of the output transistors is obtained only for an ESD event that produces a voltage on the bond pad that rises more rapidly than 100 volts per nanosecond. In that manner, normal information signals do not cause conduction via the protective circuitry. The capacitor 205 is illustratively of the MOS type, wherein a conductive polysilicon layer forms a first capacitor plate, and a doped semiconductor substrate (or tub) region forms the second capacitor plate, with a gate-level silicon dioxide layer forming the capacitor dielectric. Alternatively, the capacitor may comprise two polysilicon layers for the plates, with a deposited dielectric therebetween. Still other capacitor types are known in the art and may be used. Illustratively, resistor 206 is formed in an n-tub in a manner comparable to resistor 209 discussed below. However, it may alternatively be formed in a p-tub, or may be a deposited resistor of the polysilicon or silicide type, or may be of another type known in the art.

In the inventive technique, means are also provided for boosting the voltage on the tub region in which the pro-driver transistor is formed during an ESD event. This boosting prevents conduction from the drain of the pre-driver to the underlying tub from limiting the voltage on the gate of the associated output transistor during an ESD event. That is, as shown in FIG. 2, the p-type drain of the pre-driver transistor 210 forms a diode 212 with the underlying n-type tub region 213 in which the drain is formed. In prior-art CMOS integrated circuit designs, the tub 213 would be connected directly to the $V_{DD}$ conductor. Therefore, conduction through the diode 212 would limit the positive voltage on the gate of output transistor 202 to no more than one junction voltage drop above the voltage on the $V_{DD}$ conductor during an ESD event. This clamping effect of diode 212 would therefore place an undesirable limitation on the effectiveness of the above-described action of protective transistor 204. Therefore, in the illustrative embodiment of the invention, a transistor 208 is connected between the bond pad 200 and the n-tub 213. This transistor 208 also exhibits bipolar breakdown when an ESD event occurs, thereby conducting charge to the n-tub 213 and raising its voltage.

Figure 1:
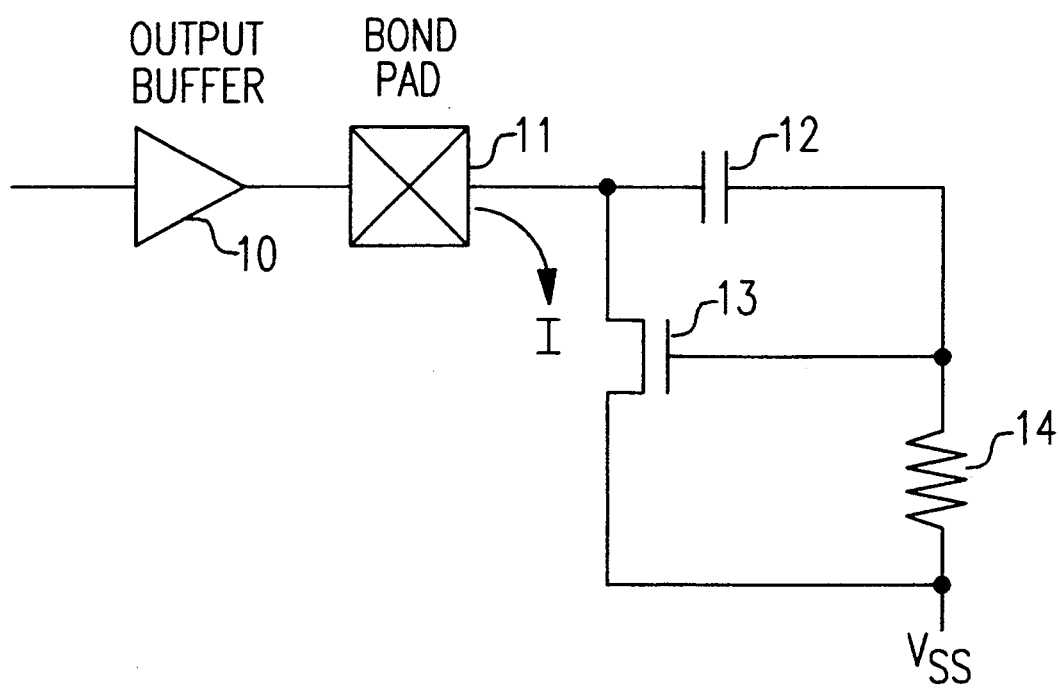
FIG. 1 shows a prior-art output protection technique.
Figure 3:
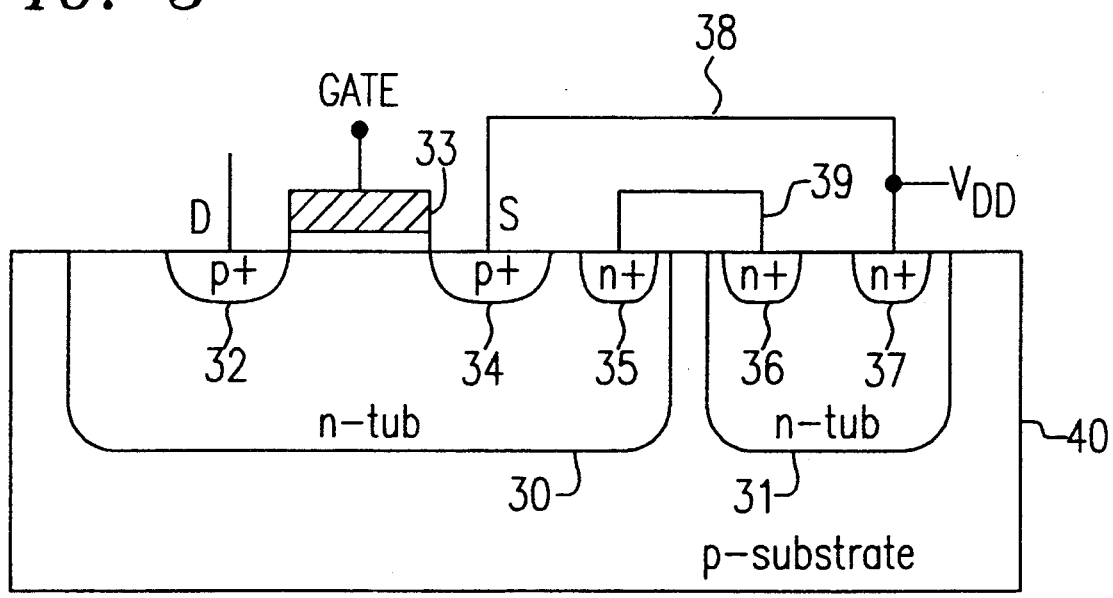
FIG. 3 shows an illustrative resistor used in one embodiment of the invention.

To allow the voltage on the n-tub 213 to rise, the n-tub is not connected directly to the $V_{DD}$ conductor, but rather through resistor 209. This resistor limits the conduction through diode 212 to the $V_{DD}$ conductor, and hence allows the voltage on the gate of output transistor 202 to rise to a higher level during an ESD event. The resistor 209 has a value of about 600 ohms in the exemplary embodiment, and is typically in the range of about 50 to 5000 ohms. The resistor may be a deposited (e.g., polysilicon) resistor, or a diffused region in the semiconductor substrate, or other type. For example, as shown in FIG. 3, an n-tub 31 may be used to form the resistor 209, which is connected to $V_{DD}$ via n+ contact region 37. The resistor is connected via n+ contact region 36, conductor 39, and n+ contact region 35 to the n-tub 30, corresponding to region 213 in FIG. 2. The p-channel pre-driver transistor (210 of FIG. 2), comprising source/drain regions 32 and 34, and gate electrode 33, is formed in n-tub 30. The p-channel transistor in the pre-driver complementary inverter 214 may be located in an n-tub similarly connected to $V_{DD}$, or alternatively in the same n-tub as transistor 210.

The inventive technique of boosting the voltage on the tub in which a pre-driver transistor is formed may be practiced independently of the embodiment shown in FIG. 2 for causing the output transistors to conduct during an ESD event. For example, the prior-art technique of connecting the gate of an output transistor (e.g., 202) to the bond pad directly with a capacitor, without the use of an additional transistor (e.g., 204), may be used. In that case, a significant benefit may still be obtained by including means (e.g., transistor 208 and resistor 209) for boosting the tub (e.g., n- tub 213) in which a pre-driver transistor (e.g., 210) is formed. This tub boost again serves to prevent a drain-to-substrate diode (e.g., 212) from interfering with the voltage applied to the gate of the output transistor. In the illustrative case shown in FIG. 3, the tub in which the pre-driver is formed is a doped semiconductor region (e.g., 30) formed in a semiconductor substrate (e.g., 40) of the opposite conductivity type (e.g., p-type). In that manner, the tub is isolated from the substrate by a p-n junction. The isolation then allows the voltage on the tub to be increased with respect to the substrate voltage, thereby avoiding a large capacitive load that would be present if the entire substrate voltage were raised during an ESD event. However, other types of tub isolation techniques are known. For example, the use of a silicon dioxide region to isolate a first doped semiconductor region from a second doped semiconductor region is known as "dielectric isolation" in the art, and is included herein.

The above embodiment has shown a transistor (e.g., 203 and 204) and an RC network (capacitor 205 and resistor 206) as the protective means that causes the output transistors (201 and 202) to conduct during an ESD event in response to the high voltage on the bond pad 200. However, other device types may be used for implementing the protective means. For example, a thyristor may serve to couple the bond pad to the gate of an output transistor, causing the output transistor to conduct when the voltage on the bond pad exceeds a desired limit. In that case, a capacitor (205) may not be present to couple the control electrode of the thyristor to the bond pad. Furthermore, the pull-down resistor (206) may not need to be present. Still other types of devices to cause conduction of the output transistors during an ESD event are possible. Note that when the ESD voltage has ceased, the protective means no longer causes the output transistor to conduct, and they are returned to control by the logic signal from the pre-driver circuitry. Normally, ESD events occur when the integrated circuit is not connected in a circuit board or multi-chip module, and hence the logic signals are not present anyway. Conversely, when connected in a circuit board or module, the normal operating logic signals may be present, but the ESD events are less likely to occur. Although digital logic circuitry has been discussed herein, the protected circuitry may be analog. Therefore, the desired operational signal ($V_{in}$) may be generally referred to as an "information signal".

As discussed above, the present technique may be used with an output buffer having only a single conductivity type of output transistor. However, it may alternatively be used with CMOS output buffers as well, wherein a p-channel transistor serves as the pull-up device and an n-channel transistor serves as the pull-down device. In that case, the n-channel pull-down device may still be protected by the circuitry shown in FIG. 2. If desired, the p-channel device may be protected with comparable circuitry, but with the transistor conductivities opposite to that shown, and also opposite power supply connections. In thai case, a resistor comparable to 209 could then be connected between the p-tub in which the n-channel pre-driver transistor is formed and the $V_{SS}$ power supply conductor. Although MOS type transistors have been shown in the illustrative embodiment, the present invention may alternatively be implemented with bipolar devices, or with mixed device types, as in BICMOS technology. Other ESD protective techniques may also be used with an output buffer protected by the inventive technique. For example, the connection between the source/drain electrodes of the output transistors and the output conductor (e.g., bond pad 200) may include a resistor, as shown for example in U.S. Pat. No. 4,990,802 coassigned herewith. Still other variations will be apparent to persons of skill in the art.

I claim:

1. An integrated circuit having an output transistor having a controlled electrode connected to an output conductor, and protective means for supplying a voltage to the control electrode of said output transistor for causing said output transistor to conduct during an electrostatic discharge event;

and further having a pre-driver circuit for supplying an information signal to said output transistor, wherein said pre-driver circuit includes at least one transistor having a drain region of a given conductivity type formed in a doped semiconductor tub region of the opposite conductivity type, thereby forming a diode;

characterized in that said integrated circuit further comprises means for increasing the voltage on said tube during an ESD event sufficiently so that said diode does not conduct, whereby clamping of said voltage supplied to said control electrode is avoided.

2. The integrated circuit of claim 1 wherein said means for increasing the voltage on said tub includes a transistor having a channel coupled between said tub and said output conductor.

3. The integrated circuit of claim 1 wherein said means for increasing the voltage on said tub includes a resistor connected between said tub and a power supply conductor.

4. The integrated circuit of claim 1 wherein said doped semiconductor tub region is an n-tub formed in a p-substrate.

5. The integrated circuit of claim 3 wherein said resistor has a value in the range of from 50 to 5000 ohms.

6. The integrated circuit of claim 4 wherein said at least one transistor formed in the n-tub is a p-channel field effect transistor.

7. An integrated circuit comprising an n-channel output transistor having a drain connected to an output conductor, and protective means for supplying a voltage to the gate of said n-channel output transistor for causing said output transistor to conduct during an electrostatic discharge event;

and further comprising a p-channel pre-driver transistor having a drain coupled to the gate o said n-channel output transistor, and with said p-channel transistor being formed in an n-tub formed in a p-substrate thereby forming a diode characterized in that said integrated circuit further comprises means for increasing the voltage on said n-tub during an ESD event sufficiently so that said diode does not conduct, whereby clamping of said voltage supplied to said gate is avoided.

8. The integrated circuit of claim 7 wherein said means for increasing the voltage on said n-tub includes a transistor having a channel coupled between said n-tub and said output conductor.

9. The integrated circuit of claim 8 wherein said transistor having a channel coupled between said n-tub and said output conductor is an n-channel transistor.

10. The integrated circuit of claim 7 wherein said n-tub is connected to a positive power supply conductor through a resistor having a value in the range of from 50 to 5000 ohms.

* * * * *